(12) United States Patent
Imanaka et al.

(10) Patent No.: US 6,733,890 B2
(45) Date of Patent: May 11, 2004

(54) INTEGRATED CERAMIC MODULE AND MICROWAVE DIELECTRIC COMPOSITION

(75) Inventors: Yoshihiko Imanaka, Kawasaki (JP); Masatoshi Takenouchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/277,106

(22) Filed: Oct. 22, 2002

(65) Prior Publication Data

US 2003/0107455 A1 Jun. 12, 2003

(30) Foreign Application Priority Data

Oct. 23, 2001 (JP) .......................................... 2001-324433
Nov. 20, 2001 (JP) .......................................... 2001-355288

(51) Int. Cl.⁷ ............................. B32B 17/06; C03C 1/00
(52) U.S. Cl. ...................... 428/426; 428/428; 428/457; 428/432; 428/472; 428/689; 428/699; 428/701; 428/702; 361/321.1; 361/321.5; 501/32; 501/134; 501/135; 501/136; 501/137; 501/138; 501/139; 501/153; 501/154

(58) Field of Search ............................... 428/457, 428, 428/432, 699, 472, 689, 701–702, 426; 361/321.1, 321.5; 501/32, 134–139, 153–154

(56) References Cited

U.S. PATENT DOCUMENTS 6,195,250 B1 * 2/2001 Matoba et al. ........... 361/321.5
6,444,598 B1 * 9/2002 Kawakami et al. ........... 501/32

* cited by examiner

*Primary Examiner*—Deborah Jones
*Assistant Examiner*—Ling Xu
(74) *Attorney, Agent, or Firm*—Armstrong, Kratz, Quintos, Hanson & Brooks, LLP

(57) ABSTRACT

An integrated ceramic module is formed of a first ceramic dielectric layer containing a glass as a sintering agent and having a high dielectric constant and high Q value, formed with an electronic component, and a second ceramic dielectric layer containing a glass as a sintering agent and having a low dielectric constant and a high Q value, formed with a signal transmission line.

9 Claims, 4 Drawing Sheets

INTEGRATED CERAMIC MODULE AND MICROWAVE DIELECTRIC COMPOSITION

CROSS-REFERENCE TO RELATED APPLICATION

The present application is based on Japanese priority applications No.2001-324433 filed on Oct. 23, 2001 and No. 2001-355228 filed on Nov. 20, 2001, the entire contents of which are hereby incorporated by reference.

BACKGROUND OF THE INVENTION

The present invention generally relates to electronic materials and more particularly to a microwave dielectric composition and an integrated ceramic module that uses such a microwave dielectric composition.

In the technology of mobile telecommunication such as cellular phones or in the technology of wireless information technology such as wireless LANs, there exists a stringent demand of compact size and lightweight construction for the terminal devices used therein in addition to the demand for transmitting large amount of information.

In order to achieve such reduction of size and weight of terminal devices, investigations are being made on the technology of high-density mounting and further on an integrated module in which a high-frequency circuit is integrated.

The size and performance of passive components such as antenna or filter depend heavily on the material used for the component. It should be noted that the wavelength of a radio wave is compressed, in a dielectric material having a dielectric constant $\epsilon$, to $1/\sqrt{\epsilon}$ the wavelength of the radio wave in a free space. Thus, the line length in a circuit, and hence the size of the component, can be reduced with increasing dielectric constant of the dielectric material used therein. Thus, increase of the dielectric constant of the material constituting the passive component is an important factor for miniaturizing the components.

On the other hand, there exists a different demand, in certain passive components such as filters and resonators in which occurrence of insertion loss is inevitable, that the dielectric material has a high Q value for minimizing the insertion loss.

Further, it is desirable to use a material of low electric resistance such as Ag, Cu or Au in passive components such as a filter circuit formed of inductance and capacitance, for reducing loss caused by the conductive lines in the passive component. However, all of these low-resistance metals have a relatively low melting point of about 1000° C. (for example, Ag has a melting point of 960° C., Cu has a melting point of 1083° C., Au has a melting point of 1063° C.), and thus, there is a need of suppressing the firing temperature of the ceramics constituting the dielectric material in the passive elements to the temperature not exceeding the melting point of the foregoing metal elements in order that such low-resistance metal material is introduced into the passive components.

Thus, in order to realize a compact, lightweight and high-performance passive elements, there is a need of a microwave dielectric composition having a large dielectric constant and high Q value, and simultaneously capable of being fired at low temperatures.

In the transmission line used in electronic circuits, and the like, such as a microwave strip line, on the other hand, there is a demand of a microwave dielectric composition having as small dielectric constant as possible for realizing high signal transmission rate. In this case, too, there is a demand that the microwave dielectric composition has a high Q value for minimizing the transmission loss. Further, there is a demand that the microwave dielectric composition is capable of being formed at low firing temperature in view of the need of forming a laminated structure together with a metal interconnection layer.

However, conventional microwave dielectric composition, while having the desired high or low dielectric constant and high Q value, has to be fired at a high temperature exceeding 1500° C., and it has not been possible to construct a passive component or transmission line having a structure laminated with a metal wiring layer.

Thus, in conventional passive components or transmission lines, a ceramic material capable of being fired at low temperatures has been used for the microwave dielectric composition. However, such ceramic materials capable of being fired at low temperatures have a Q value of about 200 at the best, and it has been difficult to realize a Q value exceeding 1000.

Meanwhile, it is desirable that the ceramic components such as antenna, filter, capacitor, and the like form a unitary, integrated ceramic module together with a ceramic signal transmission line connecting the foregoing components electrically from the viewpoint of reducing the size and weight of the terminal devices. However, the microwave dielectric composition used for antenna, filter or capacitor is required to have a large dielectric constant in addition to the high Q value as noted before, while the microwave dielectric composition used for the signal transmission line is required to have a low dielectric constant in addition the high Q value.

When attempt is made to form an integral module by laminating the components formed of ceramic materials of different nature, it is inevitable to conduct a process of firing the laminated structure in which different ceramic material layers are laminated in the same ambient at the same temperature. However, because of the different firing shrinkage characteristics of the ceramic materials, there is a tendency that problems such as poor adherence between the ceramic layers, formation of cracks or delamination, may take place in such a firing process as a result of the different firing shrinkage characteristics of the ceramic materials and the firing shrinkage caused at the time of the firing process.

SUMMARY OF THE INVENTION

Accordingly, it is a general object of the present invention to provide a novel and useful microwave dielectric composition wherein the foregoing problems are eliminated.

Another and more specific object of the present invention is to provide a microwave dielectric composition having a high Q value and high dielectric constant or high Q value and low dielectric constant and is capable of being fired at a low temperature of 900° C. or less.

Another object of the present invention is to provide an integrated ceramic module formed of a multi-functional and multilayer laminated structure, in which a ceramic dielectric layer having a high Q value and high dielectric constant and formed with an electronic component therein and a ceramic dielectric layer having a high Q value and a low dielectric constant and formed with a transmission line therein are laminated.

Another object of the present invention is to provide a high-dielectric microwave dielectric composition, characterized by oxide ceramic particles, and an oxide-base amorphous glass, in which the oxide ceramic particles are dispersed, or an oxide-base crystallized glass, wherein the oxide ceramic particles contains at least one component selected from the group consisting of $BaTi_4O_9$, $Ba_2Ta_9O_{20}$, $Ba(Zn_{1/3}Ta_{2/3})O_3$, $Ba(Zn_{1/3}Nb_{2/3})O_3$, $Ba(Mg_{1/3}Ta_{2/3})O_3$, $Ba(CO_{1/3}Ta_{2/3})O_3$, $Ba(CO_{1/3}Nb_{2/3})O_3$, $Ba(Ni_{1/3}Ta_{2/3})O_3$ and $TiO_2$.

According to the present invention, it becomes possible to obtain a high-dielectric or low-dielectric microwave dielectric composition having a very high Q value and still capable of being fired at a low temperature of about 900° C. or less, by using the ceramic particles selected from the foregoing group of $BaTi_4O_9$, $Ba_2Ta_9O_{20}$, $Ba(Zn_{1/3}Ta_{2/3})O_3$, $Ba(Zn_{1/3}Nb_{2/3})O_3$, $Ba(Mg_{1/3}Ta_{2/3})O_3$, $Ba(Co_{1/3}Ta_{2/3})O_3$, $Ba(Co_{1/3}Nb_{2/3})O_3$, $Ba(Ni_{1/3}Ta_{2/3})O_3$ and $TiO_2$ and having a high Q value and an oxide-base amorphous glass or oxide-base crystallized glass having a high Q value.

Another object of the present invention is to provide an integrated ceramic module characterized by a first ceramic dielectric layer containing a glass as a sintering agent and having a high dielectric constant and a high Q value, the first ceramic layer being formed with an electronic component, and a second ceramic dielectric layer laminated on the first ceramic dielectric layer, the second ceramic dielectric layer containing a glass as a sintering agent and having a low dielectric constant and a high Q value, the second ceramic dielectric layer being formed with a signal transmission line.

According to the present invention, glasses are added to the first and second ceramic dielectric layers as respective sintering agents, and because of this, it becomes possible to adjust the sintering characteristics at the time of firing these ceramic layers from respective green sheets to be coincident between the first ceramic layer and the second ceramic layer. As a result, it becomes possible to fire the first ceramic dielectric layer and the second ceramic dielectric layer simultaneously in the state that the respective green sheets are laminated with each other.

DETAILED DESCRIPTION OF PREFERRED EMBODIMENT OF THE INVENTION

[First Embodiment]

Figure 1:
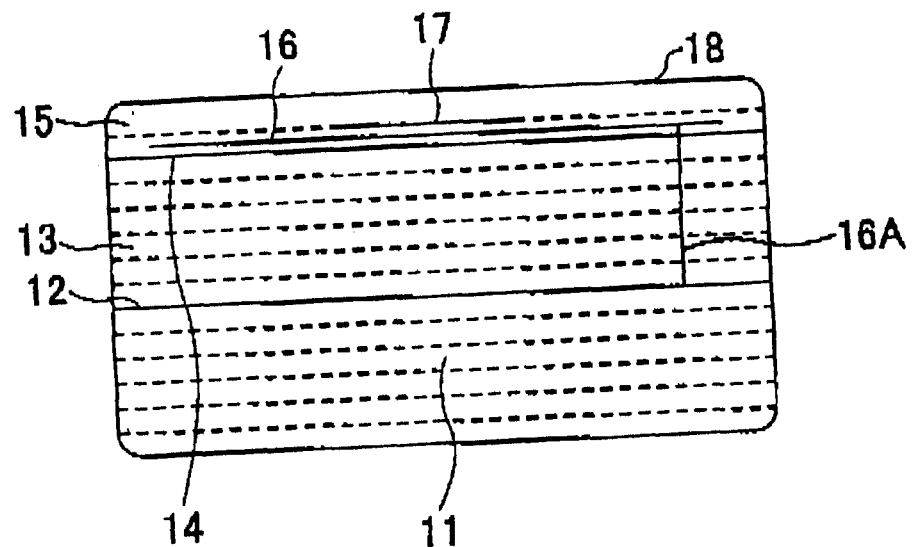
FIG. 1 is a diagram showing the construction of a laminated LC filter according to a second embodiment of the present invention.

Hereinafter, the microwave dielectric composition prepared by the inventor of the present invention will be explained as a first embodiment of the present invention.

Experiment 1

A $TiO_2$ ceramic powder characterized by average particle diameter of 5 μm is mixed with a glass powder characterized by average particle diameter of 3 μm with respective proportions of 20 volumetric % and 80 volumetric %, and a powder mixture is prepared. The glass powder is the one causing precipitation primarily of $Nd_2TiO_7$ crystals (GA55 of Nippon Electric Glass, Co., Ltd.). On the other hand, the $TiO_2$ ceramic powder is prepared by calcining a $TiO_2$ block to a temperature of 1500° C. and then pulverizing the $TiO_2$ block thus calcined to a predetermined particle size. The powder mixture thus obtained is added with a PVB resin with 2 volumetric % and milled for 20 hours by using a ball mill.

The slurry thus obtained is then dried and pulverized, after removing acetone, by using a mortar. The powder mixture thus obtained is then loaded in a mold as a mixed powder source material and a pressure-molding process is conducted under a pressure of 5 MPa. By conducting firing to the mixed powder source material thus molded in the air at 900° C. for 2 hours, a dielectric material is obtained.

As a result of measurement of relative density conducted to the dielectric material thus obtained, it was shown that the dielectric material has a relative density of 99% or more. Further, the measurement of the dielectric characteristics conducted at the frequency of 2 GHz revealed that the dielectric material has a Q value of 2500 as measured by a cavity resonance method and a specific dielectric constant of 50.

Experiment 2

An alumina ($Al_2O_3$) ceramic power characterized by average diameter of 5 μm and purity of 99% or more is mixed with a $TiO_2$ powder characterized by average particle diameter of 1 μm and a glass powder (GA63 of Nippon Electric Glass Co., Ltd.) characterized by average diameter of 3 μm with respective proportions of 10 volumetric %, 20 volumetric % and 70 volumetric % to form a powder mixture, wherein the glass powder is the one causing precipitation of primarily $CaMgSi_2O_4$ crystals. The powder mixture thus obtained is milled similarly as before and slurry is formed. In this case, too, the alumina ceramic powder is once calcined at a high temperature of 1500° C. or more and pulverized subsequently.

The slurry thus obtained is dried similarly as before and pulverized to form a mixed powder source material. The mixed powder source material thus obtained is pressure-molded, and a dielectric material is obtained by firing the mixed powder source material thus molded in the air at 900° C. for 2 hours.

It was shown that the dielectric material thus obtained has a relative density of 99% or more. Further, measurement of the dielectric characteristics revealed that the dielectric material has a Q value of 3500 as measured by a cavity resonance method and a specific dielectric constant of 40.

Experiment 3

A powder of alumina ($Al_2O_3$) ceramic characterized by average particle diameter of 5 μm and purity of 99% or more is mixed with a quartz glass powder characterized by average particle size of 1 μm and purity of 99% or more and an alumino-borosilicate glass powder characterized by average particle size of 3 μm and silica ($SiO_2$) content of 85% or more, with respective proportions of 10 volumetric %, 20 volumetric % and 70 volumetric %, to form a powder mixture. The powder mixture thus obtained is then subjected to a milling process similarly as before to form a slurry. In this case, too, the alumina ceramic powder is formed by calcining at high temperature of 1500° C. or more and pulverizing to the desired particle diameter.

The slurry thus obtained is then dried and pulverized similarly to the case of the first embodiment and a mixed powder source material is formed. By conducting a pressure-molding process on the mixed powder source material and by firing the mixed powder source material thus molded in the air at 900° C. for two hours, a dielectric material is obtained.

The measurement of relative density conducted to the dielectric material thus obtained showed that the dielectric material has a relative density of 99% or more. Further, the measurement of the dielectric characteristics revealed that the dielectric material has a Q value of 4000 as measured by a cavity resonance method and a specific dielectric constant of 7.

Experiment 4

A ceramic powder of $Ba(Mg_{1/3}Ta_{2/3})O_3$ characterized by average diameter of 5 μm is mixed with a $TiO_2$ powder characterized by average diameter of 5 μm and a glass powder (GA55 of Nippon Electric Glass Co., Ltd.) that causes precipitation of $Nd_2TiO_7$ crystals, with respective proportions of 20 volumetric %, 20 volumetric % and 60 volumetric %, for form a powder mixed. Further, acetone and a PVB resin are added to the powder mixture thus obtained with a proportion of 2 volumetric %, and a slurry is formed by conducting a milling process in a ball mill for 20 hours. In this case, the $Ba(Mg_{1/3}Ta_{2/3})O_3$ ceramic powder is prepared by calcining at a high temperature of 1500° C. or more and pulverizing to a desired particle diameter subsequently.

The slurry thus obtained is then dried similarly to the previous Embodiment 1 and, after removing the solvent, pulverized to form a powder mixture source by using a mortar. The mixed powder source material thus obtained is then pressure-molded in a mold under the pressure of 5 MPa, and the mixed powder source material thus molded is fired in the air for 2 hours to form the dielectric material.

The measurement of relative density conducted to the dielectric material showed that the dielectric material has a relative density of 99% or more. Further, the measurement of the dialectic characteristics conducted on the dielectric material at the frequency of 2 GHz showed that the dielectric material has a Q value of 3500 as measured by a cavity measurement method and a specific dielectric constant of 35.

Experiment 5

A $BaTi_4O_9$ ceramic powder characterized by average particle diameter of 5 μm is mixed with a glass powder (GA55 of Nippon Electric Glass Co., Ltd.) characterized by average particle diameter of 3 μm and causing precipitation of $Nd_2TiO_7$ crystals to form a powder mixture. The powder mixture thus obtained is then added with acetone and a PVB resin with a proportion of 2 volumetric %. Further, by conducting a milling process in a ball mill for 20 hours, slurry is obtained. In this case, too, the $BaTi_4O_9$ ceramic powder is prepared by calcining at a high temperature of 1500° C. or more and pulverizing to a predetermined particle diameter.

The slurry thus obtained is then dried similarly to the case of the first embodiment, and, after removing the solvent, pulverized by a mortar to form a mixed powder source material.

The mixed powder source material thus obtained is subjected to a pressure-molding process in a mold at the pressure of 5 MPa, and a dielectric material is obtained by conducting a firing process on the mixed powder source material thus molded in the air at 900° C. for 2 hours.

The measurement of the relative density conducted on the dielectric material thus obtained revealed that that the dielectric material has a relative density of 99% or more. Further, the measurement of the dielectric characteristics conducted at the frequency of 2 GHz revealed that the dielectric film has a Q value of 3200 as measured by the cavity resonance method and a specific dielectric constant of 32.

Table 1 below shows the dielectric constant, Q value, firing temperature and the possible electrode material corresponding to the firing temperature, together with the result of a comparative experiment conducted on a conventional microwave dielectric composition.

TABLE 1

| | PRESENT INVENTION | | | |
|---|---|---|---|---|
| | (EMBODIMENT1) $TiO_2$—$Nd_2TiO_2$-base crystallized glass | (EMBODIMENT2) $Al_2O_3$—$TiO_2$ $CaMgSi_2O_4$-base crystallized glass | (EMBODIMENT3) $Al_2O_3$-quartz glass aluminosilicate glass | (EMBODIMENT 4) $Ba(Mg_{1/3}Ta_{2/3})O_3$—$TiO_2$—$NdTiO_7$-base crystallized glass |
| dielectric constant (@ 2 GHz) | 50 | 40 | 7 | 35 |
| Q value (@ 2 GHz) | 2,500 | 3,500 | 4,000 | 3,000 |
| firing temperature (° C.) | 900 | 900 | 900 | 900 |
| possible conductor | Ag | Ag | Ag | Ag |

| | PRESENT INVENTION (EMBODIMENT 5) $BaTi_4O_9$—$Nd_2TiO_7$-base crystallized glass | CONVENTIONAL | |
|---|---|---|---|
| | | alumina/ glass base | $CaZrO_3$/ glass base |
| dielectric constant (@ 2 GHz) | 32 | 8 | 12 |
| Q value (@ 2 GHz) | 3,200 | 150 | 200 |
| firing temperature (° C.) | 900 | 1000 | 950 |
| possible conductor | Ag | Cu | Ag—Pd |

Referring to Table 1, it can be seen that the Q value exceeds 2000 in the microwave dielectric composition obtained in the foregoing Embodiment 1-Embodiment 5 in spite of the fact that the microwave dielectric composition is fired at a temperature of 900° C. in which use of Ag is possible for the electrode material. Further, it can be seen that a high specific dielectric constant of 30 or more or a low specific dielectric constant of less than 10 is achieved depending on the application of the microwave dielectric composition. Because of the fact that the amorphous glass or crystallized glass used in the present invention has a softening point in the range of 400–900° C., it is possible to form a passive component having a construction in which a low-resistance metal electrode of Ag, Au or Cu is held between the layers of microwave dielectric composition, by conducting a simple firing process.

As explained before, the ceramic powder used in the present invention is prepared by calcining a ceramic source material once at a high temperature of 1500° C. and pulverizing subsequently to the desired particle size. While the ceramic powder thus formed has a very high Q value, the result of the foregoing Embodiments 1–5 shows that there occurs no or minimum degradation of the Q value in the case such a ceramic powder is used in combination with an amorphous glass or crystallized glass having a softening point of 400–900° C.

In the case of a conventional microwave dielectric composition that uses alumina powder and a glass or a $CaZrO_3$ powder and a glass, on the other hand, the Q value of only 150–200 is achieved even in the case the firing temperature is set to 1000° C., in which use of Cu is possible for the electrode material. This means that, while the ceramic powder itself has a high Q value, the Q value of the microwave dielectric composition itself is degraded significantly when the ceramic powder is dispersed in the glass.

Thus, according to the present invention, it becomes possible to realize a microwave dielectric composition suitable for constructing a LC circuit or microstrip line together with a low-resistance metal. Thereby, it is preferable that each component constituting the microwave dielectric composition itself has a Q value of 1000 or more in the wavelength band of 1 GHz or more but not exceeding 100 GHz.

In the present invention, it should be noted that the oxide ceramic powder dispersed in the amorphous glass or crystallized glass is not limited to the one having the foregoing composition but can be selected from any of $BaTi_4O_9$, $Ba_2Ta_9O_{20}$, $Ba(Zn_{1/3}Ta_{2/3})O_3$, $Ba(Zn_{1/3}Nb_{2/3})O_3$, $Ba(Mg_{1/3}Ta_{2/3})O_3$, $Ba(CO_{1/3}Ta_{2/3})O_3$, $Ba(Co_{1/3}Nb_{2/3})O_3$, $Ba(Ni_{1/3}Ta_{2/3})O_3$ and $TiO_2$.

In the present invention, it is also possible to use an amorphous glass containing an $SiO_2$ component and an $Al_2O_3$ component such that total of the $SiO_2$ component and the $Al_2O_3$ component is 85% or more for the amorphous glass.

Further, it is possible in the present invention to use a crystallized glass such that the crystallized glass causes precipitation of the crystalline phase of any of $CaSiO_3$, $Nd_2TiO_7$ and $CaMgSi_2O_4$.

Further, it is possible to add any of alumina with the purity of 99% or more, a quartz glass with the purity of 99% or more, $CaZrO_3$, $BaTiO_3$, $MgO$, $ZrSnTiO_4$, $CaTiO_3$, $MgTiO_3$, $SrTiO_3$, as a third component.

[Second Embodiment]

Figure 2:
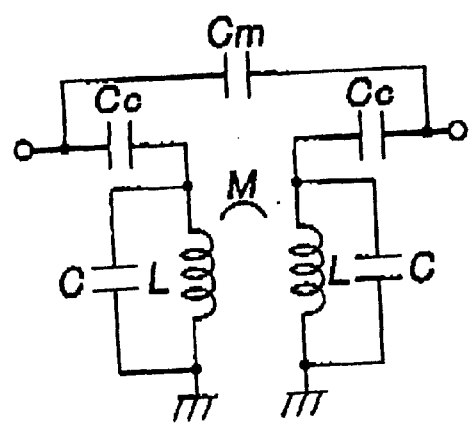
FIG. 2 is a diagram showing the equivalent circuit diagram of the laminated LC filter of FIG. 1.
Figure 3:
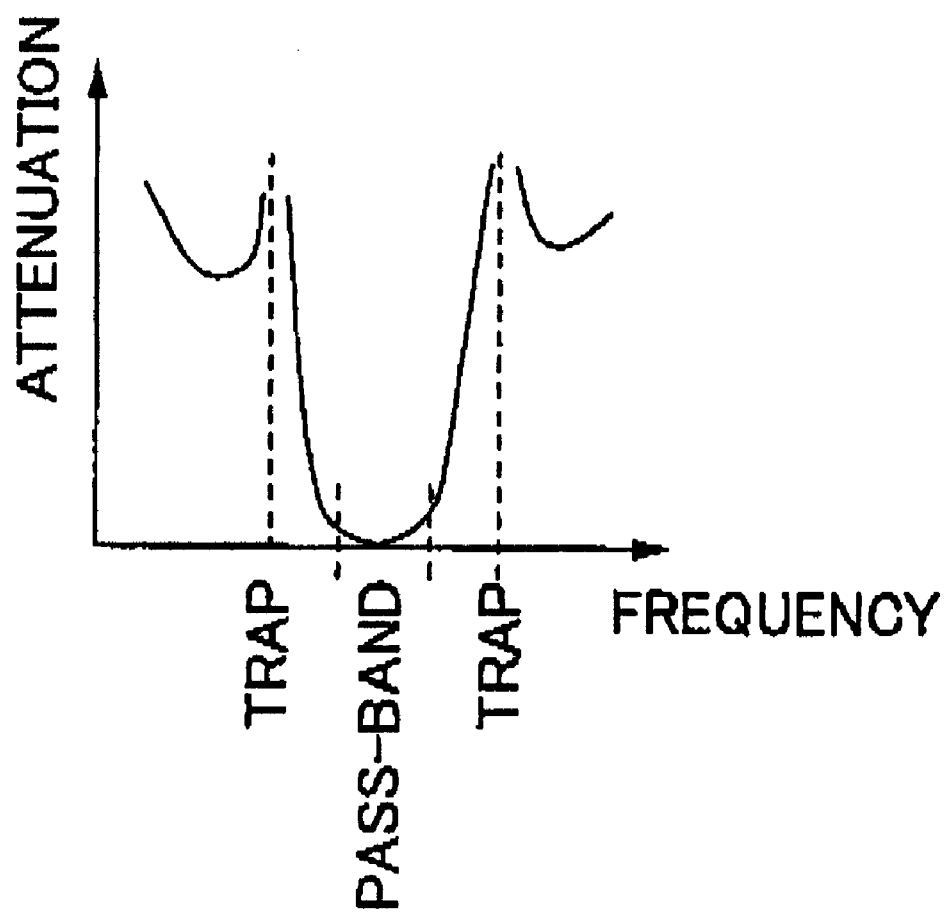
FIG. 3 is a diagram showing the frequency characteristics of the laminated LC filter of FIG. 1.

FIG. 1 shows the construction of a laminated LC filter 10 that uses the microwave dielectric composition of the present invention while FIG. 2 shows the equivalent circuit diagram of the laminated LC filter 10. Further, FIG. 3 shows the frequency characteristics thereof. In FIGS. 1–3, it should be noted that the structure of the laminated LC filter 10 itself, the equivalent circuit diagram, and the general frequency characteristic are known.

Referring to FIG. 1, the laminated LC filter 10 has a structure in which dielectric layers 11, 13 and 15, each formed of any of the high-dielectric microwave dielectric composition of the previous Embodiments 1, 2 or 4, 5, are laminated, and an electrode layer 12 constituting the inductance L of FIG. 2 is interposed between the dielectric layers 11 and 13.

Further, a ground electrode layer 14 is interposed between the dielectric layers 13 and 15, and an electrode layer 16 constituting capacitance C and an electrode layer 17 constituting capacitance Cs of FIG. 2 are embedded in the dielectric material 15. The electrode layer 16 is connected to the electrode layer 12 via a conductive plug 16A formed in the electrode layer 14 and the dielectric layer 13.

The laminated LC filter 10 as a whole is covered with a ground electrode.

The laminated LC filter 10 having such a construction includes therein a pair of LC resonators coupled with each other by a mutual conductance M and mutual capacitance Cm and forms a band-pass filter having a pass band characteristic shown in FIG. 3.

Figure 4:
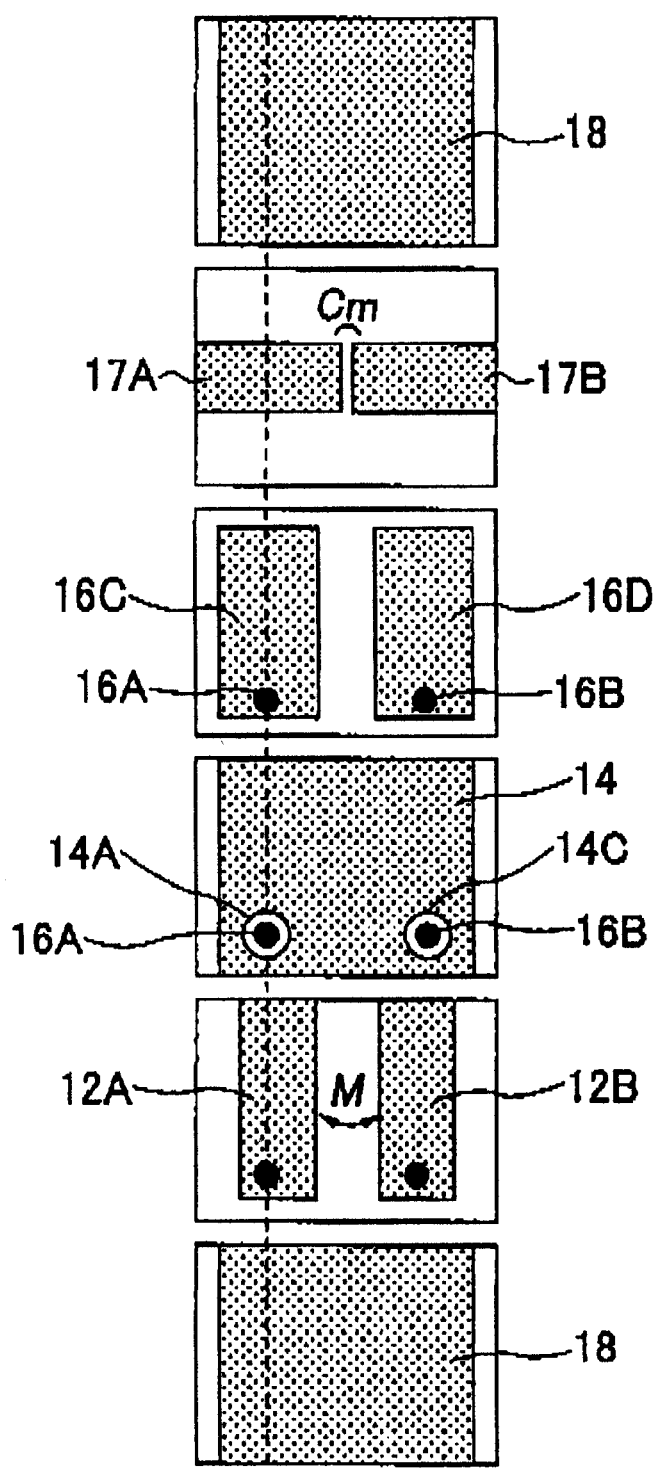
FIG. 4 is a diagram showing the pattern of the electrode layer used in the laminated LC filter of FIG. 1.

FIG. 4 shows the constitution of the electrode layers 12, 14, 16, 17 and 18 of FIG. 1. The cross-sectional diagram of the LC filter 10 shown in FIG. 1 corresponds to the cross-section taken along the broken line in FIG. 4. The structure of FIG. 4 itself is known.

Referring to FIG. 4, the electrode layer 12 is formed of two electrode patterns 12A and 12B and the mutual inductance M of the LC circuit is determined by the separation of the electrode patterns 12A and 12B. The electrode layer 16 is formed of the electrode pattern 16C and 16D, and the conductive plug 16A is formed in correspondence to the electrode pattern 16C and the conductive plug 16B is formed in correspondence to the electrode pattern 16C. Further, through holes 14A and 14B are formed in the electrode layer 14 in correspondence to the conductive plugs 16A and 16B.

Further, the electrode layer 17 is formed of electrode patterns 17A and 17B, and the capacitance Cm of FIG. 1 is determined by controlling the separation between the electrode patterns 17A and 17B.

In the present embodiment, it becomes possible to form the laminated LC filter 10 including therein a metal electrode between the dielectric layers or inside the dielectric layers by a simple firing process conducted in the air, by using the microwave dielectric composition capable of being fired at low temperature explained before. The microwave dielectric composition of the present invention is characterized by a large Q value and provides excellent pass band characteristics. Because of the large dielectric constant, the laminated LC filter 10 can be formed with a compact size.

While not illustrated, it is also possible to construct a microstrip line of reduced loss by using the low-K dielectric microwave dielectric composition explained with reference to Embodiment 3.

[Third Embodiment]

Figure 5:
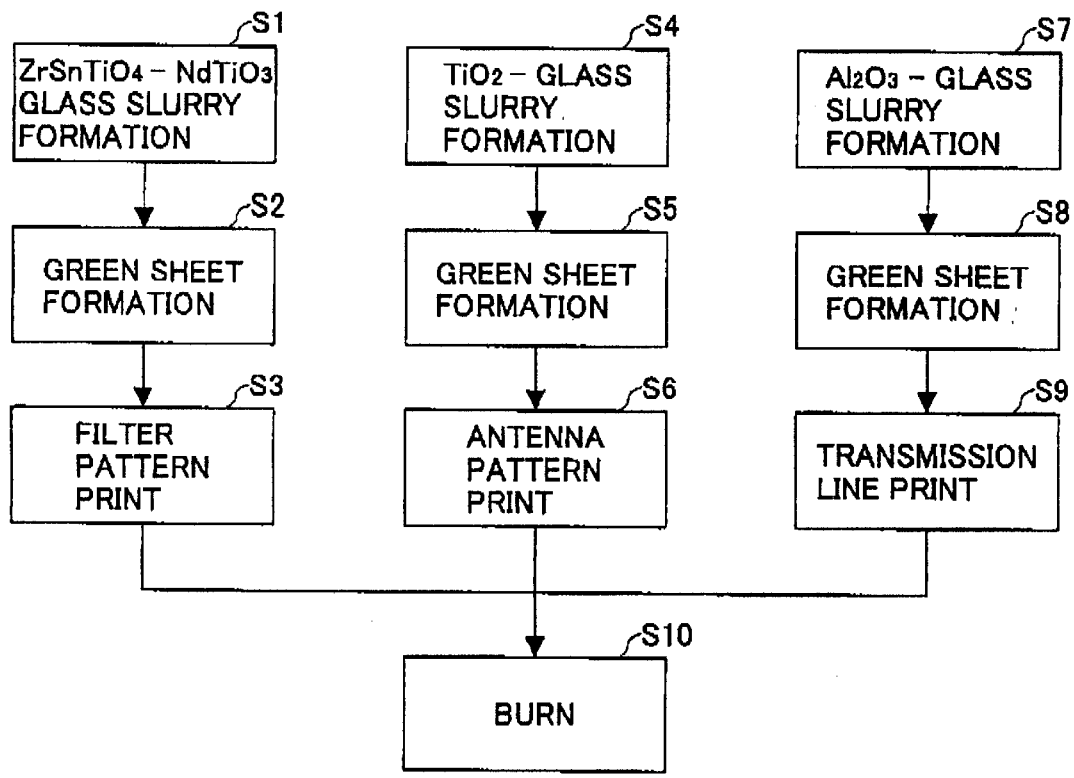
FIG. 5 is a flowchart showing the manufacturing process of an integrated ceramic module according to a third embodiment of the present invention.

Next, the manufacturing process of an integrated ceramic module according to a third embodiment of the present invention will be explaine with reference to the flowchart of FIG. 5.

Referring to FIG. 5, the ZrSnTiO4 powder of average particle diameter of 5 μm and a borosilicate glass powder of average particle diameter of 3 μm are blended with respective proportions of 20 volumetric % and 80 volumetric % in a first step 1, wherein the borosilicate glass is the glass that causes precipitation of $NdTiO_3$ crystals. The glass powder mixture thus obtained is added further with a PVB (polyvinyl butyral) powder with 8 weight % and dibuthylenephthalate with 3 weight %, and is mixed in a ball mill for 20 hours after being added with acetone as a solvent.

Next, in the step 2, the slurry thus obtained is formed by using a doctor blade and a green sheet is formed with a thickness of 200 μm. The green sheet thus obtained is then cut or punched according to the predetermined shape.

Next, in the step 3, a filter pattern is screen-printed on a green sheet member thus obtained by using a conductive paste containing Ag.

Next, in the step 4, a TiO2 powder characterized by average particle diameter of 1 μm and a borosilicate glass powder characterized by average particle size of 3 μm are blended with respective proportions of 30 volumetric % and 70 volumetric %, and slurry is formed similarly to the step 1.

Further, it the step 5, the slurry formed in the step 4 is used and a green sheet having a thickness of 200 μm is formed by using a doctor blade. In the step 5, the green sheet thus obtained is cut or punched according to a predetermined form and a green sheet member is obtained.

Next, in the step 6, an antenna pattern is screen-printed on the green sheet member obtained in the step 5 by using a conductive paste that contains Ag.

Further, in the step 7, an $Al_2O_3$ powder characterized by average particle diameter of 5 μm is blended with a quartz glass powder characterized by average particle diameter of 1 μm and an alumino-silicate glass powder characterized by average particle size of 3 μm with respective proportions of 10 volumetric %, 20 volumetric % and 70 volumetric %. Further, by conducting the process similar to that of the step 1, slurry is obtained.

Next, in the step 8, the slurry formed in the step 7 is used and a green sheet having a thickness of 200 μm is formed by a doctor blade. In the step 8, the green sheet thus obtained in cut or punched and a green sheet member is formed.

Next, in the step 9, a transmission circuit pattern is screen-printed on the green sheet member obtained in the step 8 by using a conductive paste that contains Ag.

Next, in the step 10, the green sheet member obtained in the step 3 and the green sheet member obtained in the step 6 and further the green sheet member obtained in the step 9 are laminated with each other, and the laminated structure thus obtained is subjected to a firing process such that the laminated structure is held initially at 100° C. for 15 minutes and then at 900° C. in the air for 2 hours. Thereby, it should be noted that, because the green sheets are added with a glass as respective sintering agents, the firing shrinkage at the time of the firing process is matched between the green sheet components, and there occurs no problem of cracking or delamination associated with the firing process.

Figure 6:
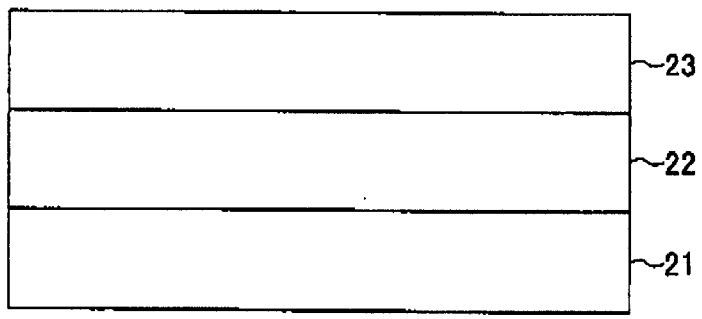
FIG. 6 is a diagram showing the construction of an integrated ceramic module formed according to the process of FIG. 5.

FIG. 6 shows a example of the integrated ceramic module thus formed.

Referring to FIG. 6, the integral ceramic module includes a ceramic component 21 corresponding to the green sheet component of the step 9 formed with a signal transmission line pattern (not shown), wherein a ceramic component 22 corresponding the green sheet component of the step 3 and carrying a filter pattern (not shown) thereon, and a ceramic component 23 corresponding to the green sheet member of the step 6 and formed with an antenna pattern thereon, are laminated on the ceramic component 21.

It was confirmed that each of the ceramic layers 21–23 thus formed has a relative density of 99% or more and has excellent electric characteristics as shown in Table 3 below. Further, it was confirmed that there is caused no delamination at any layer interface.

TABLE 3

| | RESPECTIVE FUNCTIONAL MATERIAL | | |
| --- | --- | --- | --- |
| | filter material $ZrSnTiO_4$—$NdTiO_3$ glass | antenna material $TiO_2$-glass | transmission circuit material $Al_2O_3$-glass |
| dielectric constant (@ 2 GHz) | 25 | 30 | 7 |
| Q value (@ 2 GHz) | 1500 | 2500 | 2000 |
| firing temperature (° C.) | 900 | 900 | 900 |
| possible conductor | Ag | Ag | Ag |

It should be noted that the conductor constituting the transmission line pattern is not limited to Ag but any of Au, Pt, Cu, Pd or a metal containing at least one of these.

Further, it should be noted that each ceramic layer in the integrated ceramic package module may be formed of a composite material layer of an oxide ceramic containing any of alumina ($Al_2O_3$), quartz ($SiO_2$), $BaTi_4O_9$, $Ba_2Ti_9O_{20}$, $CaZrO_3$, $CaTiO_3$, $MgTiO_3$, $ZrSnTiO_4$, $Ba(Zn_{1/3}Ta_{2/3})O_3$, $Ba(Zn_{1/3}Nb_{2/3})O_3$, $Ba(Mg_{1/3}Ta_{2/3})O_3$, $Ba(CO_{1/3}Nb_{2/3})O_3$, $Ba(Ni_{1/3}Ta_{2/3})O_3$, $SrTiO_3$, $BaTiO_3$, $MgO$, $TiO_2$, $Nd_2Ti_2O_7$ and $CaMgSi_2O_6$, and an oxide glass or a crystallized oxide glass. Thereby, it is preferable that such an oxide glass or crystallized oxide glass is the one free from Pb and having a softening temperature of 400–900° C.

While explanation has been made above with regard to preferable embodiments, the present invention is never limited to such a specific embodiment but various modifications and changes may be made within the scope described in claims.

What is claimed is:

1. An integrated ceramic module, comprising:

a first ceramic dielectric layer containing a glass as a sintering agent and having a high dielectric constant and a high Q value, said first ceramic dielectric layer being formed with an electronic component; and a second ceramic dielectric layer laminated on said first ceramic dielectric layer, said second ceramic dielectric layer containing a glass as a sintering agent and having a low dielectric constant and a high Q value, said second ceramic dielectric layer being formed with a signal transmission line.

2. The integrated ceramic module as claimed in claim 1, wherein said glass contains a crystallized glass.

3. The integrated ceramic module as claimed in claim 1, wherein said first ceramic dielectric layer and said second ceramic dielectric layer have substantially the same firing shrinkage.

4. The integrated ceramic module as claimed in claim 1, wherein said signal transmission line is formed of a metal containing at least one element selected from the group consisting of Ag, Au, Pt, Cu and Pd.

5. The integrated ceramic module as claimed in claim 1, wherein said glass belongs to the same material system in each of said first and second ceramic dielectric layers.

6. The integrated ceramic module as claimed in claim 1, wherein said glass is formed, in each of said first and second ceramic dielectric layers, of a silicate glass.

7. The integrated ceramic module as claimed in claim 1, wherein each of said first and second ceramic dielectric layers is formed of a composite body of an amorphous oxide ceramic and an oxide glass or a crystallized oxide glass.

8. The integrated ceramic module as claimed in claim 7, wherein said oxide ceramic is formed of a material selected from the group consisting of alumina ($Al_2O_3$), quartz ($SiO_2$), $BaTi_4O_9$, $Ba_2Ti_9O_{20}$, $CaZrO_3$, $CaTiO_3$, $MgTiO_3$, $ZrSnTiO_4$, $Ba(Zn_{1/3}Ta_{2/3})O_3$, $Ba(Zn_{1/3}Nb_{2/3})O_3$, $Ba(Mg_{1/3}Ta_{2/3})O_3$, $Ba(Co_{1/3}Nb_{2/3})O_3$, $Ba(Ni_{1/3}Ta_{2/3})O_3$, $BaTiO_3$, $SrTiO_3$, $MgO$, $TiO_2$, $Nd_2Ti_2O_7$ and $CaMgSi_2O_6$.

9. The integrated ceramic module as claimed in claim 7, wherein said the amorphous oxide glass or the crystallized oxide glass of said composite body is formed of a lead-free glass material having a softening point in the temperature range of 400–900° C.

* * * * *